United States Patent
Rodrigue

[19]

[11] Patent Number: 6,157,140
[45] Date of Patent: Dec. 5, 2000

[54] SEQUENTIALLY PULSED ENERGY FLOW LOOP

[76] Inventor: Joseph Edward Rodrigue, 301 Bronco Trail, Little Elm, Tex. 75068

[21] Appl. No.: 09/223,477

[22] Filed: Dec. 30, 1998

[51] Int. Cl.[7] .................................................. H05B 37/00
[52] U.S. Cl. .................................. 315/241 S; 315/241 P; 315/200 A; 315/323; 315/360
[58] Field of Search ............................ 315/241 S, 241 P, 315/200 A, 323, 324, 360, 341, 325; 362/227, 242, 363

[56] References Cited

U.S. PATENT DOCUMENTS

| | | | |
|---|---|---|---|
| 3,758,817 | 9/1973 | Elliott | 315/151 |
| 3,769,546 | 10/1973 | Pecher et al. | 315/241 P |
| 3,806,829 | 4/1974 | Duston et al. | 315/242 X |
| 4,005,333 | 1/1977 | Nichols | 315/173 |
| 4,246,514 | 1/1981 | Metzger | 315/241 P |
| 4,580,201 | 4/1986 | Williams | 362/227 |
| 4,896,119 | 1/1990 | Williamson et al. | 330/4.3 |
| 5,285,310 | 2/1994 | Miller et al. | 359/338 |
| 5,386,431 | 1/1995 | Tulip | 372/68 |

*Primary Examiner*—Haissa Philogene
*Attorney, Agent, or Firm*—Thomas V. Malorzo; Bennett & Weston PC

[57] ABSTRACT

A plurality of energy emitters, such as flash tubes for visibile light or speakers for audio emissions, are placed in communication with an appropriate trigger circuit, one circuit for each of the energy emitters. Each trigger circuit is placed in communication with a timing circuit which communicates sequentially with each of the trigger circuits and is in communication with means to adjust an input energy level delivered to the timing circuit. When a trigger circuit is in communication with the timing circuit, energy is delivered to the trigger circuit to cause the transmission of input energy through the trigger circuit sufficient to cause the emission of energy by the energy emitter. A plurality of energy collectors appropriate to the nature of the emitted energy, are maintained in spatial arrangement to the energy emitter for the purpose of recovering spurious or nonfocused energy released by the emitter and from other sources of spurious energy within the system. The energy collectors are isolated from the input energy adjusting means. Spurious energy collected by the energy collectors is routed back into the system and reused within the system either as input energy or trigger circuit energy.

15 Claims, 5 Drawing Sheets

SEQUENTIALLY PULSED ENERGY FLOW LOOP

FIELD OF THE INVENTION

This invention relates generally to the field of energy production and energy recovery which is not related to a specific form of energy, but is intended to include all forms of radiant energy.

More specifically, this invention relates to a means of energy production made up of a plurality of energy sources having varying firing and decay cycles so as to prolong the release of energy from any one complete cycle, together with mean s to recover at least some of the spurious energy released from the energy sources.

DESCRIPTION OF THE PRIOR ART

A number of light amplification devices have become known in the art, chiefly in the area of lasers where there is an interest in varying, that is either increasing or decreasing, the output power of the laser. For example, U.S. Pat. No. 4,896,119 to Williamson, et al for a CW Pumped Variable Repetition Rate Regenerative Laser Amplifier System describes a variable amplification system wherein laser seed input pulses from an Nd: YAG laser oscillator are injected into a regenerative amplifier. The amplified output from the regenerative amplifier is passed through a controller to vary the frequency of the output laser beam. U.S. Pat. No. 5, 386,431 to Miller, et al for a High Power Regenerative Laser Amplifier which describes a means to cause a laser beam to pass through a gain medium several times thereby increasing the output power of the laser without causing damage to the optics as a result of beam perturbations. U.S. Pat. No. 5,386,431 to Tulip for a Regenerative Amplifier Laser Array describes a means for increasing the power of a $CO_2$ laser with a stable $CO_2$ slab laser coupled array.

Using sequentially switched multiple Xenon bulbs in an integral unit to provide a sustained source of high intensity lighting is disclosed in U.S. Pat. No. 4,580,201 to Williams. However, this idea is not novel. U.S. Pat. No. 4,246,514 to Metzger for Energy-Saving Electronic Strobe Flash Apparatus Having Dual Flashtubes discloses using two flashtubes and a sequential triggering mechanism to provide an extended light flash. Williams, however, recognized that in a group of flashtubes the decay time will vary so that a group of tubes fired sequentially will, because of the variable decay time produce a light which to the eye appears continuous. Metzger, however depends on the rapid firing of the two tubes to maintain an almost even brightness without regard to the differing decay times for each tube.

Williams, however, failed to recognize that if a bulb filled with noble gas is energized by a charge which is much greater than the minimum required to cause the light to illuminate, the length of time the charge must be delivered is proportionately less.

The concept of utilizing a greater than required charge to fire an energy producing apparatus for a shorter period of time where said firing produces a greater than average energy burst is new and novel.

The concept of placing an energy recovery device, such as a photocell for luminous energy, a microphone for sound energy or the like, around the periphery of the source to recover at least some of the spurious radiation from the energy emitter is also new and novel.

OBJECTS OF THE INVENTION

It is an object of the invention to provide an energy source which produces emitted energy in a greater than normal quantity.

It is a still further object of the invention to provide a means to recover spurious energy for reuse by the system.

Various further objectives and advantages for multiple use of this invention will become more apparent from the following descriptions and drawings, illustrating the preferred and alternative embodiments of the invention.

DESCRIPTION OF THE PREFERRED EMBODIMENT

The description which follows for purposes of clarity is based upon a circuit and device similar to that disclosed in U.S. Pat. No. 4,580,201 to Williams.

Figure 1:
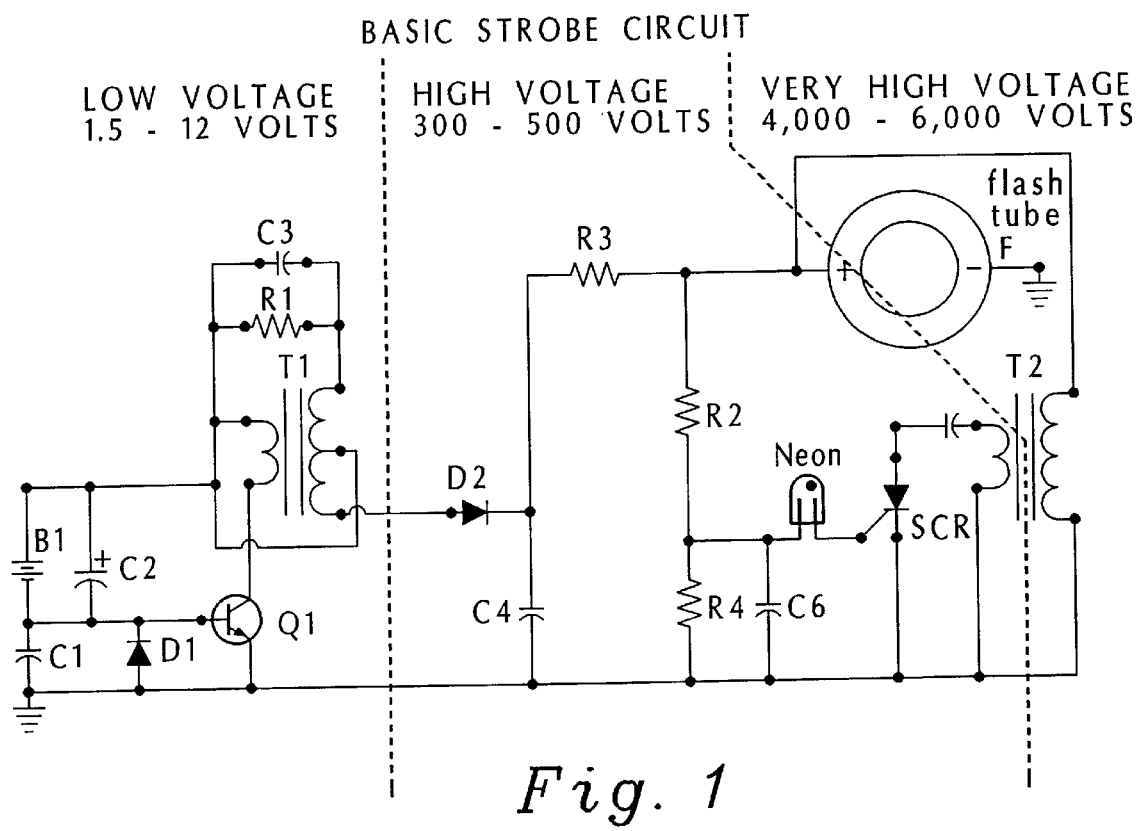
FIG. 1 is an electrical schematic showing generally a basic strobe circuit.

Referring to FIG. 1, a Basic Strobe Circuit is presented. Beginning at the left side of FIG. 1, voltage from Battery B1, which delivers 1.5 to 12 volts, depending on the size of the battery, is delivered to transformer T1 which delivers 300–500 volts from the high voltage stage through diode D2 which acts as a gate to prevent the reverse flow of electricity to the battery B1. The increased voltage from the high voltage section transformer T1 is delivered to transformer T2 which increases the output voltage still further to the 4,000–6,000 volts necessary to fire the flash tube F which is filled with a noble gas such as Xenon, or a combination of noble gasses.

Figure 2A:
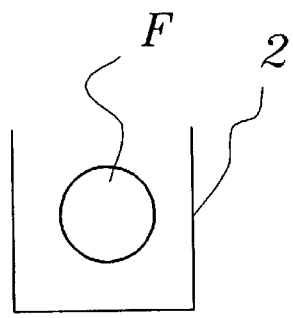
FIG. 2a is an end plan view schematic diagram showing the arrangement of a flashtube for converting electricity to light energy and a solar cell for recovering the emitted light energy and converting it to electricity.
Figure 2B:
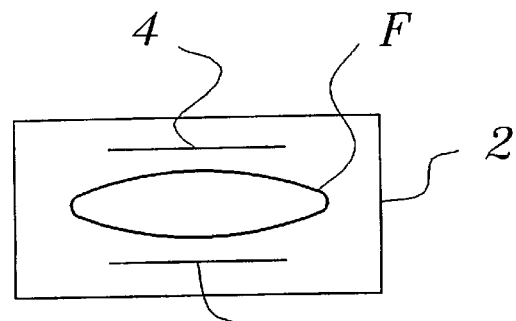
FIG. 2b is a top plan view schematic diagram showing the arrangement of a flashtube for converting electricity to light energy, a solar cell for recovering the emitted light energy and converting it to electricity and a thermocouple for recovering the emitted heat energy and converting it to electricity.

It is well known that when a flash tube fires, it delivers both light and heat. In FIG. 2a, a solar cell 2 is shown in close proximity to the flash tube, and in FIG. 2b, both a solar cell 2 and thermocouple wires 4 are shown in close proximity to the flash tube.

Typically, a single solar cell or a single thermocouple is only capable of delivering minuscule amounts of electricity, usually just enough to act as a signal to another device, however, it has been recently shown that a plurality of solar cells is capable of generating useable amounts of electricity. Likewise it is well known that thermocouples placed in quantity near a heat source are also capable of delivering useable amounts of electricity. Thus placing a plurality of Photocells thermocouples in close proximity to a group of flash tubes which are configured to fire in a predetermined sequence so as to produce an essentially steady beam of light, such as that disclosed in Williams, '201, a useable and steady amount of electricity will be produced.

Figure 3A:
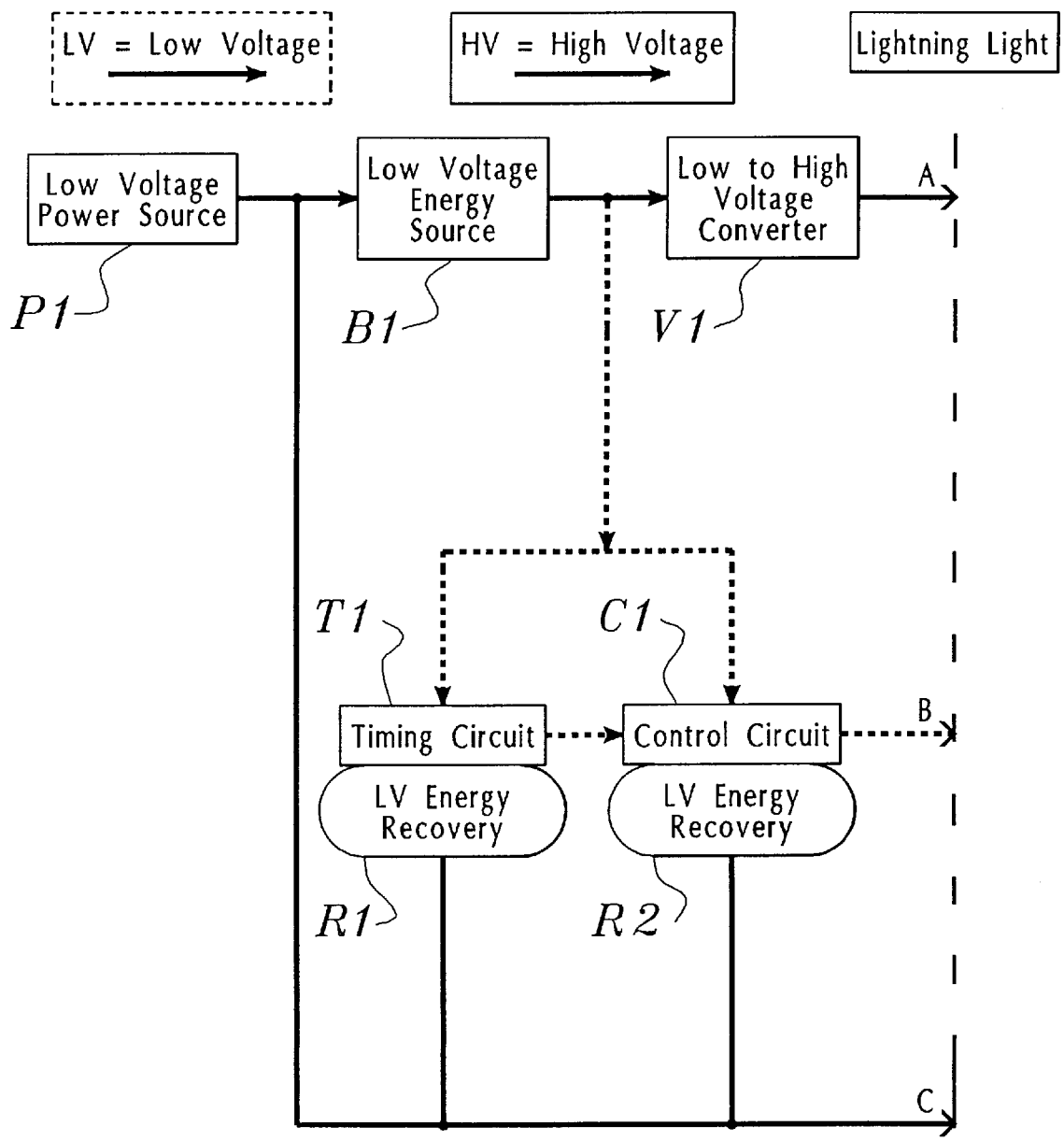
FIG. 3 is a block diagram depicting the energy recovery system together with an energy producing system.
Figure 3B:
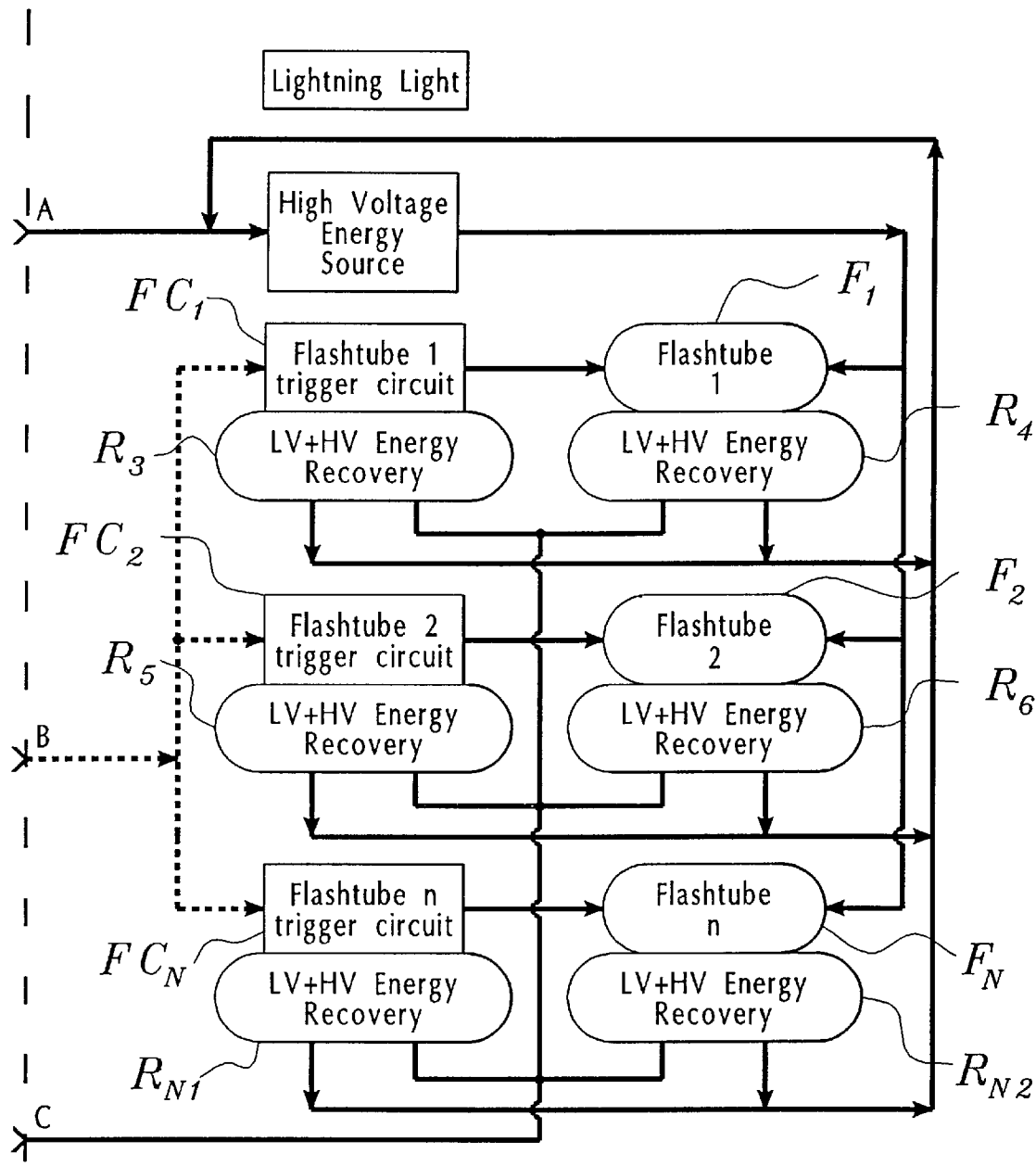

FIG. 3 depicts, in block diagram, the conversion of low voltage from a low voltage power source P1 to a means for storing low voltage, such as a battery B1. Low voltage from the low voltage storage device, B1 may be shunted to either the timing circuit T1 or to the control circuit C1 or to a DC to DC voltage converter V1 wherein the low voltage from the battery or other energy source is converted to sufficiently high voltage to fire the flash tubes $F_1, F_2 \ldots F_n$. The output of timing circuit T1 is in communication with the input of control circuit C1. The control circuit can be either an SCR, a Triac in a MOSFET device, or any electronic or mechanical device with a similar function which can be fired, as shown in FIG. 1, by applying sufficient voltage to neon bulb to cause it to arc or light thereby completing the circuit to the firing connection of an SCR. The output of control circuit C1 is in communication with trigger circuits $FC_1$ through $FC_n$, which, in turn is in communication with and controls the flashing of flash tubes $F_1$ through $F_n$. In this configuration, which shows the preferred embodiment of the invention, low voltage energy recovery system R1, comprising at least one thermocouple, is in close proximity to timing circuit T1, and low voltage energy recovery system R2, comprising at least one thermocouple, is in close proximity to control circuit C1. Trigger circuits $FC_1$ through $FC_n$ are each connected to an Energy Recovery Systems $R_3, R_4 \ldots R_n$, which comprise thermocouples to recover the dissipated heat energy from the trigger circuits. Flashtubes $F_1, F_2 \ldots F_n$ have energy recovery systems $R_4, R_6 \ldots R_{n2}$ arrayed around the flashtubes to intersect and recover some of the spurious light and heat radiation such flashtubes emit. The output from all of the energy recovery systems described above is collected and returned to the Low Voltage Energy Storage Unit B1.

Figure 4:
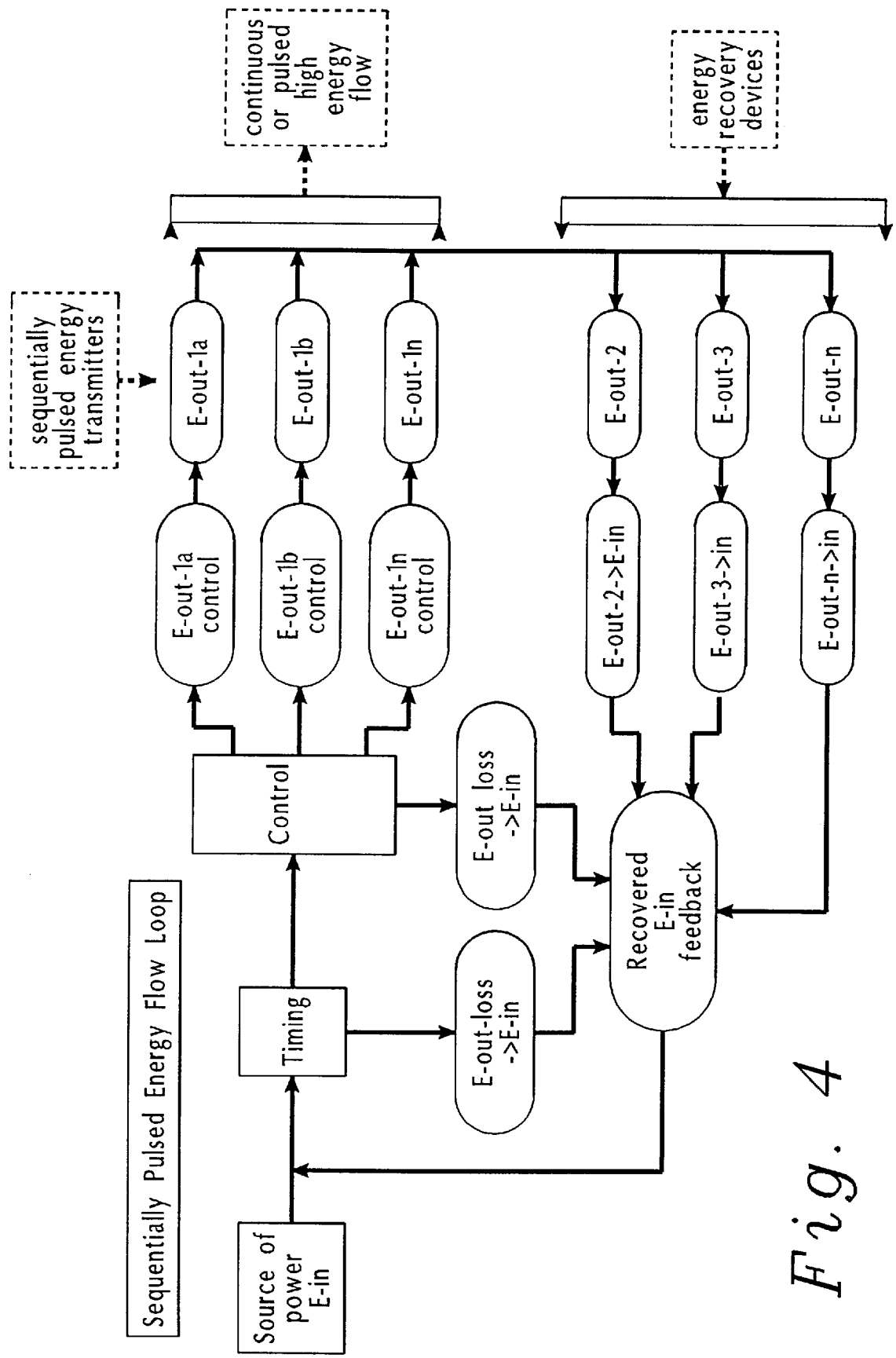
FIG. 4 is a block diagram depicting multiple energy producers together with the energy recovery system.

FIG. 4 depicts in block form the concept that the energy emitters may be arranged in an array of any configuration and, optimally, are sequentially pulsed to provide maximum continuous output, as may the energy recovery systems, so long as the recovery systems are in close proximity to the emitters.

Figure 5:
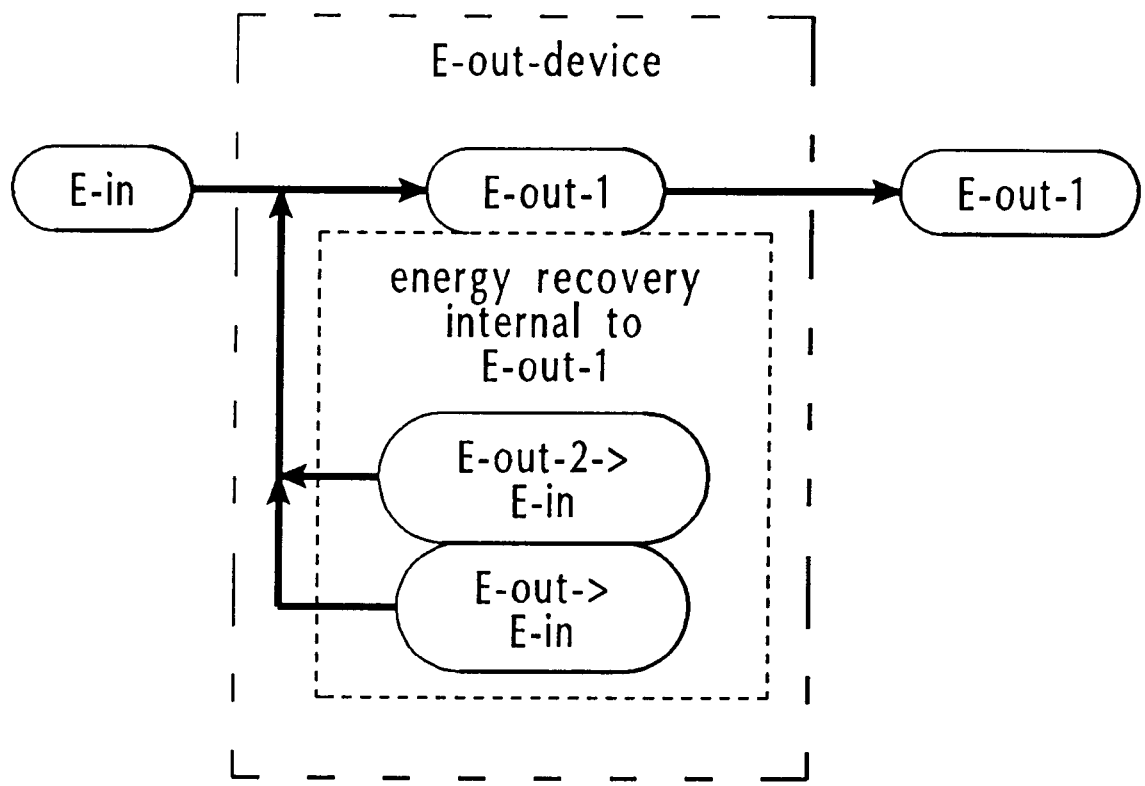
FIG. 5 is a block diagram depicting an alternative embodiment of an energy producing system and energy recovery system.

FIG. 5 depicts in block form the concept that both the emitter(s) and the recovery system(s) may be enclosed in the same housing.

For purposes of this application it is intended that emitters include not only flash tubes, but also any source of heat and/or sound, such as an audio speaker.

Additional advantages and modifications will readily occur to those skilled in the art. Therefore, the Invention in its broader aspects is not limited to the specific details, and representative devices and methodologies shown are described herein. Accordingly, various modifications may be made without departing from the spirit or scope of the general inventive concept as defined by the appended claims and their equivalents.

What is claimed is:

1. A sequentially pulsed energy delivery and recovery system which comprises
   a. a plurality of sources of energy placed in a close physical array with reference to each other;
   b. a separate trigger circuit in communication with each of said energy sources;
   c. a timing circuit which communicates sequentially with each trigger circuit;
   d. means capable of adjusting input energy level from an energy source in communication with said timing circuit;
   e. means in communication with said sources of energy capable of delivering input energy sufficient to cause the release of energy; and
   f. a plurality of energy recovery devices positioned to recover spurious energy released from said energy sources and from other sources of spurious energy release within the system, said energy recovery devices being isolated from said input energy adjusting means which is in communication with said separate trigger circuit.

2. The sequentially pulsed energy delivery and recovery system of claim 1 wherein said energy source is chosen from the group which comprises flash tubes filled with one or more noble gas, a source of radiant heat energy, and audio speakers.

3. A The sequentially pulsed energy delivery and recovery system of claim 2 wherein said gas filled flash tubes are filled with a noble gas chosen from the group comprising Helium, Argon, Krypton, Xenon and Radon.

4. The sequentially pulsed energy delivery and recovery system of claim 3 wherein more than one noble gas is present and the concentration of each noble is between 0% and 100%.

5. The sequentially pulsed energy delivery and recovery system of claim 1 wherein said trigger circuit is a MOSFET device.

6. The sequentially pulsed energy delivery and recovery system of claim 1 wherein said trigger circuit is a triac.

7. The sequentially pulsed energy delivery and recovery system of claim 1 wherein the means capable of adjusting the input energy level from a power source comprises a transformer.

8. The sequentially pulsed energy delivery and recovery system of claim 1 wherein said means capable of adjusting the input energy level from a power source comprises a DC to DC voltage converter.

9. The sequentially pulsed energy delivery and recovery system of claim 8 wherein the output voltage of the DC to DC voltage converter is sufficient to cause said trigger circuit to fire.

10. The sequentially pulsed energy delivery and recovery system of claim 1 wherein said timing circuit comprises a switch which places said individual trigger circuit and said energy source in communication with one another in a predetermined sequence.

11. The sequentially pulsed energy delivery and recovery system of claim 10 wherein said timing circuit comprises electronic switching means which places said individual trigger circuit said energy source and in communication with one another in a predetermined sequence.

12. The sequentially pulsed energy delivery and recovery system of claim 1 wherein said energy recovery devices comprise at least one device chosen from the group of photocell, microphone and thermocouple.

13. The sequentially pulsed energy delivery and recovery system of claim 1 wherein said trigger circuit is a Silicon Controlled Rectifier (SCR).

14. A sequentially pulsed energy delivery system comprising at least one source of output energy in communication with a trigger circuit which causes said source of output energy to release said output energy according to a predetermined sequence, said trigger circuit being in communication with a timing circuit which determines said predetermined sequence in which said source of output energy is called upon to discharge, a source of input energy sufficient to cause said source of output energy to discharge, said source of input energy being in communication with said timing circuit, and a plurality of energy recovery devices, each of which is in communication with said timing cicuit, positioned to recover at least a portion of spurious energy released from said output energy source.

15. An energy delivery system comprising at least one source of output energy in communication with a trigger circuit which supplies power sufficient to cause said source of output energy to discharge, said trigger circuit being in communication with a timing circuit which directs power sufficient to cause said discharge, said timing circuit in communication with a source of power capable of delivering power in sufficient quantity to cause said source of energy to discharge in a predetermined sequence, and at least one energy recovery device which is placed in the path of said discharge to capture at least a portion of said output energy discharge, said energy recovery device being in communication with said timing circuit, said energy recovery device being isolated from said source of power to allow partial recharging of said trigger circuit utilizing said recovered energy.

* * * * *